US012597877B2

(12) United States Patent
　Pizzato

(10) Patent No.: US 12,597,877 B2
(45) Date of Patent:　Apr. 7, 2026

(54) SAFETY DEVICE, SYSTEM AND METHOD FOR MONITORING AN ELECTRIC MOTOR

(71) Applicant: PIZZATO ELETTRICA S.R.L., Marostica (IT)

(72) Inventor: Giuseppe Pizzato, Marostica (IT)

(73) Assignee: PIZZATO ELETTRICA S.R.L., Marostica (IT)

( * ) Notice: Subject to any disclaimer, the term of this patent is extended or adjusted under 35 U.S.C. 154(b) by 161 days.

(21) Appl. No.: 18/436,321

(22) Filed: Feb. 8, 2024

(65) Prior Publication Data

US 2024/0275325 A1　Aug. 15, 2024

(30) Foreign Application Priority Data

Feb. 10, 2023　(IT) ........................ 102023000002343

(51) Int. Cl.
　*H02P 29/024*　　(2016.01)
　*G01R 31/34*　　(2020.01)
(52) U.S. Cl.
　CPC .......... *H02P 29/024* (2013.01); *G01R 31/343* (2013.01)
(58) Field of Classification Search
　CPC ..... H02P 29/024; H02P 29/02; G01R 31/343; G01R 31/34; G01R 19/0084; G01R 19/16576; G01R 23/005; G01R 23/02; H02H 7/085; H02H 7/08; H02K 11/20; H02K 11/30

USPC .................................................. 318/461, 445
See application file for complete search history.

(56) References Cited

U.S. PATENT DOCUMENTS

| | | | | |
|---|---|---|---|---|
| 5,767,639 | A | * | 6/1998 | Sakaguchi ............. G11B 19/28 318/400.11 |
| 6,049,284 | A | * | 4/2000 | Heuer ....................... F16P 3/08 318/671 |
| 9,110,451 | B2 | * | 8/2015 | Ogawa .................. H02P 29/027 |
| 2015/0346739 | A1 | | 12/2015 | Swanson et al. |
| 2018/0076753 | A1 | | 3/2018 | Donolo et al. |

FOREIGN PATENT DOCUMENTS

EP　　　　3731408 A1　10/2020

* cited by examiner

*Primary Examiner* — David Luo
(74) *Attorney, Agent, or Firm* — INNOVATION CAPITAL LAW GROUP, LLP; Vic Lin

(57) ABSTRACT

A safety device (10) for monitoring an electric motor (101) connected to a power supply line (100) and equipped with a drive shaft (102). The safety device (10) comprises a control unit (12) having detection means, adapted to detect at least two physical quantities related to and associated with the operation of the electric motor (101), signaling means configured to transmit a control signal (C) generated by a first processing unit (17), which is connected to the detection means and the signaling means and configured to transmit the control signal (C) by means of the signaling means. The processing unit (17) is configured to compare the at least two physical quantities with each other, in order to detect faults or anomalies and to generate the control signal (C) on the basis of the aforementioned comparison.

9 Claims, 9 Drawing Sheets

SAFETY DEVICE, SYSTEM AND METHOD FOR MONITORING AN ELECTRIC MOTOR

TECHNICAL FIELD

The present invention refers to a safety device and a related method for monitoring the functionality of an electric motor.

The device and the method according to the invention are used, by way of example, in industrial machines or systems where it is necessary to monitor the speed of an electric motor to determine whether the machine or the system is in a condition of safety.

STATE OF THE ART

Industrial applications are known wherein it is necessary to monitor the speed of an electric motor of an apparatus.

A first example is the monitoring of the speed of the electric motor to determine whether it is not running, i.e. whether it has a speed equal to zero, in order to allow or not allow a user access to a dangerous area where the electric motor is placed.

This case is typical of automatic or semi-automatic machines such as, for example, band saws, disc saws, etc., wherein the electric motor is used to move loads having a high inertia and which could still be in motion for a period of time after turning off the engine.

A second example is the monitoring of the speed of the electric motor to determine whether it is not running, i.e. whether it has a speed equal to zero, in order to signal to an external device, or to an operator, that the electric motor is actually not running, or in order to signal a situation of emergency.

This case is typical of automatic or semi-automatic machines such as, for example, hoists, cranes, etc., wherein the electric motor is used to lift suspended loads that have a weight sufficient to set the electric motor in motion even when it is no longer powered.

A third example is the monitoring of the speed of the electric motor to determine whether it is within a predetermined range, in order to determine whether the electric motor is working correctly and possibly signal a situation of emergency in the event that the speed of the electric motor is not within the predetermined range. This case is typical of automatic or semi-automatic machines wherein the speed of the electric motor depends on the operating state of the machine, such as, for example, in machines in maintenance mode which require the presence of a maintenance technician inside them, or in semi-automatic machines wherein an interaction is envisaged between a component moved by the electric motor and an operator.

To determine if the electric motor is not running, i.e. if it has a speed equal to zero, it is known to use safety devices, such as the one described in U.S. Pat. No. 6,049,284, which involve measuring the voltage on the phases of the electric motor when it is no longer powered and to compare the measured voltage with a reference voltage.

When the measured voltage is less than the reference voltage then the motor is considered stopped and the safety device signals that the machine is in a condition of safety.

Instead, to determine if the speed of the electric motor is within a predetermined range, it is known to use devices which involve connecting an optical or magnetic sensor to the shaft of the electric motor, which transmits a signal codifying the speed of the electric motor.

Alternatively, to check if the electric motor's speed falls within a set range, it is known to use devices that sample the voltage measured from the motor's power supply to ascertain the motor's rotational frequency.

A first drawback of the devices of the state of the art is that, in case it is necessary to monitor whether the engine of a machine is not running when it is not powered and whether its speed is safe when it is powered, at least two independent and separate devices are required.

This is disadvantageous because it requires a lot of space to place the safety devices inside the machine, as well as complicated wiring operations subject to a high risk of human error.

Furthermore, the use of two independent and separate devices makes it very complicated to check them and verify the presence of any faults, reducing the safety of the machine where they are installed.

A further disadvantage of the prior art is that, in the event of a failure of one of the two independent and separate devices, the aforementioned devices can give inconsistent information and, therefore, decrease the safety level of the machine where they are installed.

Furthermore, known devices such as the one described in US2018/076753A1 generally provide a single input channel connected to the power supply of an electric motor for detecting the frequency of the alternating current on the electric motor supply and the actual rotational speed of the electric motor shaft.

The features of such devices are in fact presented in the preamble of claim 1.

The aim of the present invention is therefore to realize a device and a safety method that make it possible to increase the operator safety.

Another aim of the present invention is therefore to realize a safety device and method which have a high robustness against faults.

Another aim of the present invention is therefore to realize a safety device which is compact and easy to install, and which makes it possible both to monitor whether the speed of an electric motor is safe and to verify whether the electric motor itself is actually not running when it is not powered.

Another aim of the present invention is to realize a safety device and method that allow the safety level of a machine or system comprising at least one electric motor to be increased.

ILLUSTRATION OF FIGURES

DESCRIPTION

Figure 1:
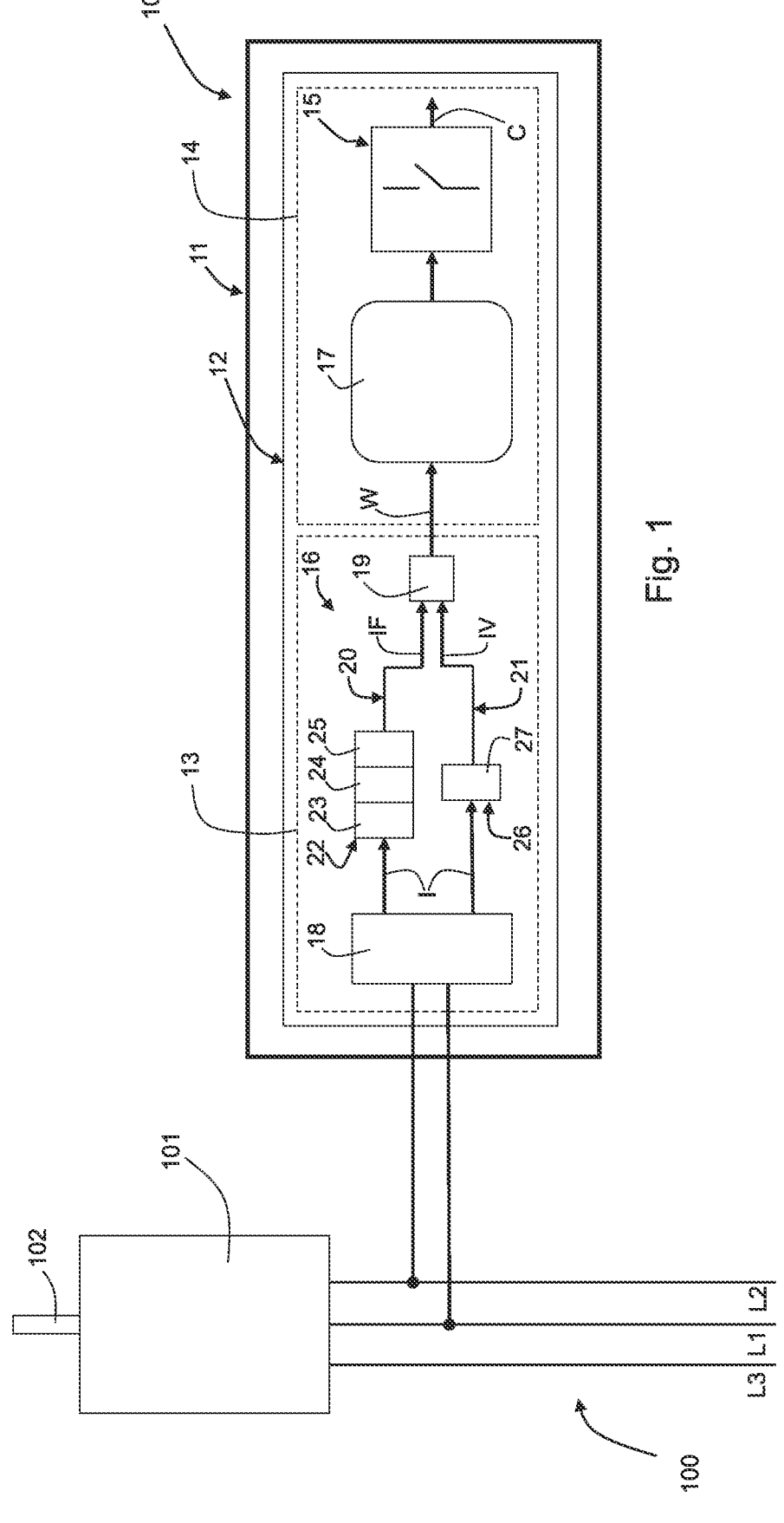
FIGS. 1 to 8 are schematic representations of a safety device in accordance with respective embodiments of the present invention.
Figure 2:
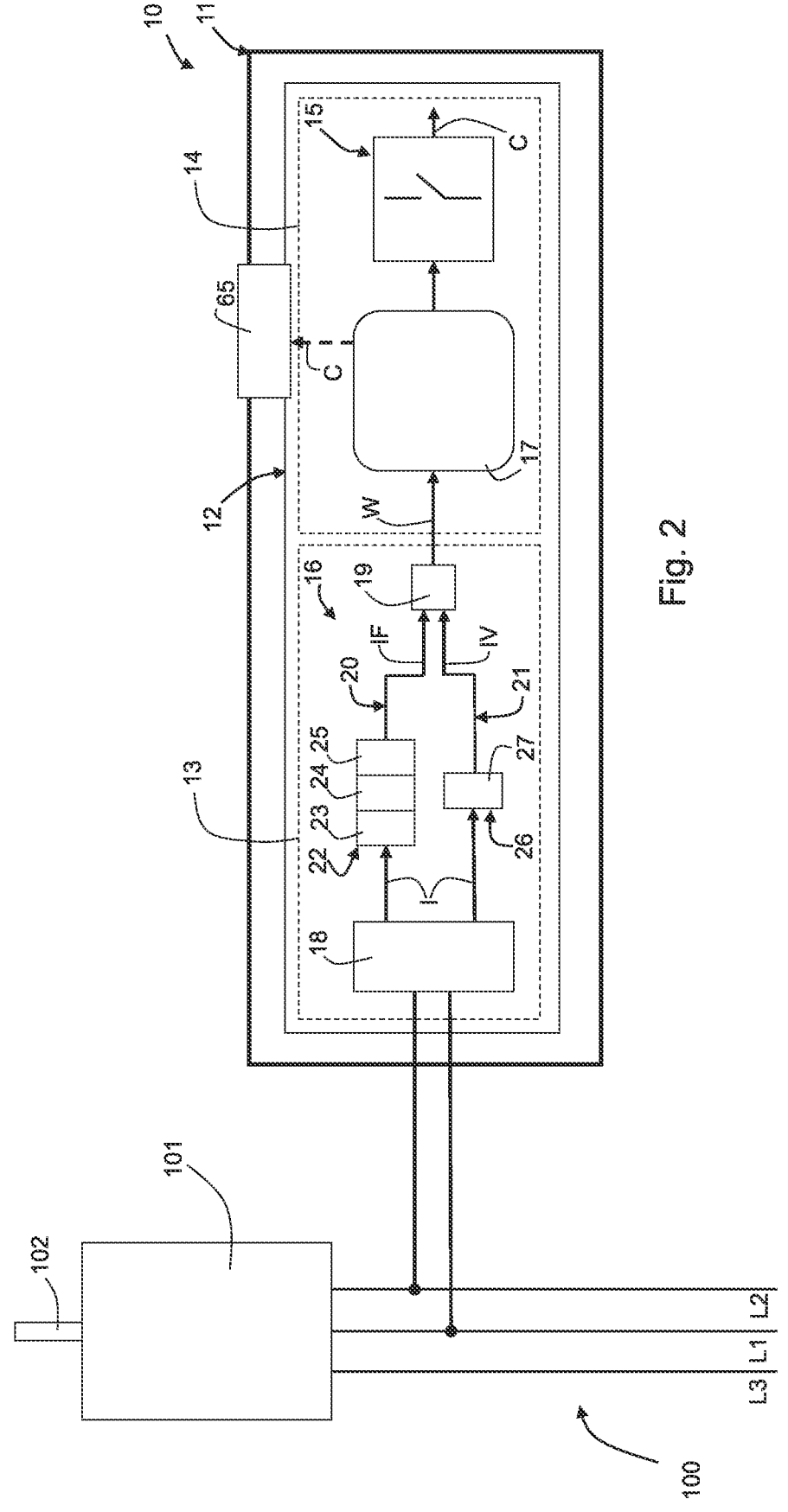

The safety device 10 according to the present invention is associated with a machine or a system, where at least one electric motor 101 is present, and is configured to transmit at least one control signal C concerning safety of the machine or the system to external users.

For example, the device 10 can be associated with a controller, for example a PLC of the machine or the system, to transmit the control signal C to the latter.

Alternatively, or in addition, the device 10 can be associated with safety components such as, for example, emergency brakes, indicators, etc., in order to control their operation by means of the control signal C.

The device 10 of the present invention allows at least two detected physical quantities associated with the operation of the electric motor 101 to be compared with each other; these two physical quantities are the rotation speed of the drive shaft 102 of the electric motor 101, the voltage and frequency measured on the power supply line of the electric motor; the comparison is performed to detect any faults or anomalous situations, such as a slipping or blocking of the electric motor 101.

In case the at least two physical quantities are the frequency and the voltage detected on the power supply 100, the comparison is performed to detect faults. In this case, if a frequency greater than zero and zero voltage are detected on the power supply 100, a fault is signaled.

Or, if the at least two detected quantities are the rotation speed and the voltage on the power supply 100, the comparison is performed to detect any faults. In this case, if a rotation speed greater than zero and a zero voltage on the power supply 100 are detected, a fault is signaled. Or again, if the at least two detected quantities are the frequency on the power supply 100 and the rotation speed, the comparison is performed to detect any anomalous blocking or slipping situations. In this case, if the frequency on the power supply 100 is greater than zero while the rotation speed is zero, then a blocking situation is signaled. Instead, if the frequency on the power supply 100 corresponds to a speed greater or less than the rotation speed actually measured on the drive shaft 102 of the electric motor 101, a slipping situation is signaled.

The device 10 comprises detection means configured to be associated with the electric motor 101 to detect said at least two physical quantities related to and associated with the operation thereof.

With reference to the attached FIGS. 1-7, the device 10 is provided with at least one case 11 containing a control unit 12 having an input section 13, which is connected to the power supply network 100 of the electric motor 101, and a safety section 14 configured to transmit control signal C.

The detection means comprise the input section 13, which is configured to detect the voltage on the power supply 100 and to transmit to the safety section 14 at least one work signal W correlated to the detected voltage.

It should be noted that herein and below, "voltage on the power supply" means the instantaneous voltage value that powers the electric motor 101 which, in case of a motor powered by AC current, varies over time according to a substantially sinusoidal function whose amplitude is the value of the supply voltage of the electric motor 101 and the period is the reciprocal of the supply voltage of the electric motor 101.

Furthermore, the safety section 14 is configured to process the work signal W and to transmit the at least one control signal C according to the work signal W, as will be described in detail below.

In a first embodiment, represented schematically in FIG. 1, the input section 13 comprises a first input channel 16 and the safety section 14 comprises a first processing unit 17 connected to the first input channel 16.

The first input channel 16 is configured to be connected to the power supply 100 of the electric motor 101 in order to instantly detect the voltage on the power supply 100 itself and to transmit to the first processing unit 17 a first work signal W correlated to said detected voltage.

For example, in the event that the power supply 100 of the electric motor 101 is of the three-phase type, the first input channel 16 can be connected in use to two phases L1, L2 of the power supply 100.

Preferably, the first input channel 16 comprises first amplification means 18 and a first measurement unit 19.

The first amplification means 18 are configured to be connected to the power supply 100 to scale the detected voltage in order to transmit to the first measurement unit 19 at least one first intermediate voltage signal IV having a voltage value lower than the detected voltage.

It should be noted that in the present description and in the attached claims the term "amplification" also includes cases where a signal is amplified by a value less than one and is therefore attenuated.

In the examples provided herein, the first intermediate voltage signal IV is a square wave correlated to the trend over time of the voltage measured between two phases L1, L2 of the power supply 100 of the electric motor 101.

By way of example, the first amplification means 18 comprise a differential amplifier, known per se and which will not be described in detail.

In addition, the amplification means 18 are connected to the first measurement unit 19 by means of a first frequency line 20 and a first voltage line 21.

The first frequency line 20 advantageously comprises first filtering circuits 22 configured to provide the first measurement unit 19 with a first intermediate frequency signal IF filtered by noise and having a maximum value acceptable by the first measurement unit 19. Said first filtering circuits 22 comprise a first order filter 23, a comparator with hysteresis 24 and a voltage divider 25 arranged in series, of a type known per se and which will not be described in detail.

The voltage line 21 comprises attenuation circuits 26 configured to provide the first measurement unit 19 with a first intermediate voltage signal IV having a maximum value acceptable by the measurement unit 19. In particular, the attenuation circuits 26 comprise a voltage divider voltage 27, which is known per se and will not be described in detail.

The first measurement unit 19 is configured to sample the first intermediate frequency signal IF and the first intermediate voltage signal IV. Furthermore, the first measurement unit 19 is configured to perform a measurement of the first intermediate frequency signal IF to obtain frequency information of the electric motor 101. In this case, this measurement provides the measurement of the period of the first intermediate frequency signal IF and therefore its frequency.

It should be noted that in the present description and in the attached claims the term "frequency" means a quantity correlated to the rotation speed of the electric motor 101.

Furthermore, the first measurement unit 19 is configured to perform a measurement of the first intermediate voltage signal IV to obtain voltage information correlated to the voltage applied to the power supply 100. In this case, the first measurement unit 19 instantaneously measures the voltage of the first intermediate voltage signal IV and the measured value corresponds to said voltage information.

The first measurement unit 19 is configured to transmit to the first processing unit 17 the aforementioned first work signal W containing said frequency information and said voltage information, preferably in digital form.

In preferred embodiments, the detection means also comprise a sensor input 60 (FIGS. 6 and 7), for example integrated in the control unit 12, connected to the first processing unit 17 and a rotation sensor 61 connected to the aforementioned input sensor 60 and configured for being placed in correspondence with the drive shaft 102 of the electric motor 101.

The rotation sensor 61 is configured to calculate, or to allow the first processing unit 17 to calculate, the actual rotation speed of the drive shaft 102 by verifying its position over time and to transmit a speed signal ω to the first processing unit 17. It should be noted that the speed signal ω can comprise information concerning the actual speed of the drive shaft 102, or information concerning the angular position of the drive shaft 102 over time.

For example, the rotation sensor 61 can comprise an inductive sensor, or a dynamo, or an encoder.

The first processing unit 17 is configured to compare at least two quantities associated with and relating to the operation of the electric motor 101 in order to detect faults or anomalies and generate said control signal C, as will be described below.

The device 10 also includes signaling means configured to transmit the aforementioned control signal C to users external to the device 10.

In some embodiments the signaling means comprise switching means 15, controlled by the first processing unit 17 and suitable for switching from an active state to an inactive state and vice versa. In this case the control signal C corresponds to the active or inactive state of the switching means 15. Alternatively, or in addition, the signaling means comprise an auxiliary output 65 connected to the first processing unit 17 and configured to allow the transmission of signals in digital form, which are generated by the processing unit 17, to external users. In this case the control signal C corresponds to the digital signals generated by the processing unit 17. By way of example, the auxiliary output 65 can comprise a USB connector, preferably of the USB-C type connected to the first processing unit 17. Alternatively, or in addition, the auxiliary output 65 can comprise an industrial field bus or a point-to-point communication bus, such as, for example, the I/O-link bus connected to the first processing unit 17.

In one embodiment, the first processing unit 17 is configured to compare the voltage information with the frequency information contained in said first work signal W.

In this case, the comparison is performed to verify that when the voltage information is less than a lower voltage limit, also the frequency information is less than a lower frequency limit, corresponding for example to 1 Hz. In case this condition is not verified, the first processing unit 17 is configured to generate a control signal C to signal a fault. Said control signal C can be transmitted by controlling said switching means 15 to switch them from the active state to the off state, or vice versa. Otherwise, said control signal C can be transmitted in digital form to external users by means of the auxiliary output 65.

In another embodiment the first processing unit 17 is configured to compare the voltage information contained in said first work signal W with the speed signal ω. In this case, the first processing unit 17 performs the comparison to verify that, if the voltage information is zero, also the speed signal ω is zero. In case this condition is not verified, the first processing unit 17 is configured to generate a control signal C to signal a fault. Said control signal C can be transmitted by controlling the switching means 15 to switch them from the active state to the off state, or vice versa. Otherwise, said control signal C can be transmitted in digital form to external users by means of the auxiliary output 65.

In a further embodiment the first processing unit 17 is configured to compare the frequency information contained in said first work signal W with the speed signal ω. In this case, the comparison is performed in order to detect any anomalous blocking or slipping situations. If the first processing unit 17 detects that the frequency on the power supply 100 is greater than zero and the rotation speed is zero, then it generates a control signal C which indicates a blocking situation. Instead, if the first processing unit 17 detects that the frequency on the power supply 100 corresponds to a speed greater or lower than the rotation speed actually measured on the drive shaft 102, it generates a control signal C which indicates a slipping situation. In this case a control signal C can be generated by commanding the switching means 15 to switch them from the active state to the off state, or vice versa. Otherwise, the control signal C can be transmitted in digital form to external users by means of the auxiliary output 65, possibly also signaling the extent of slipping.

Figure 4:
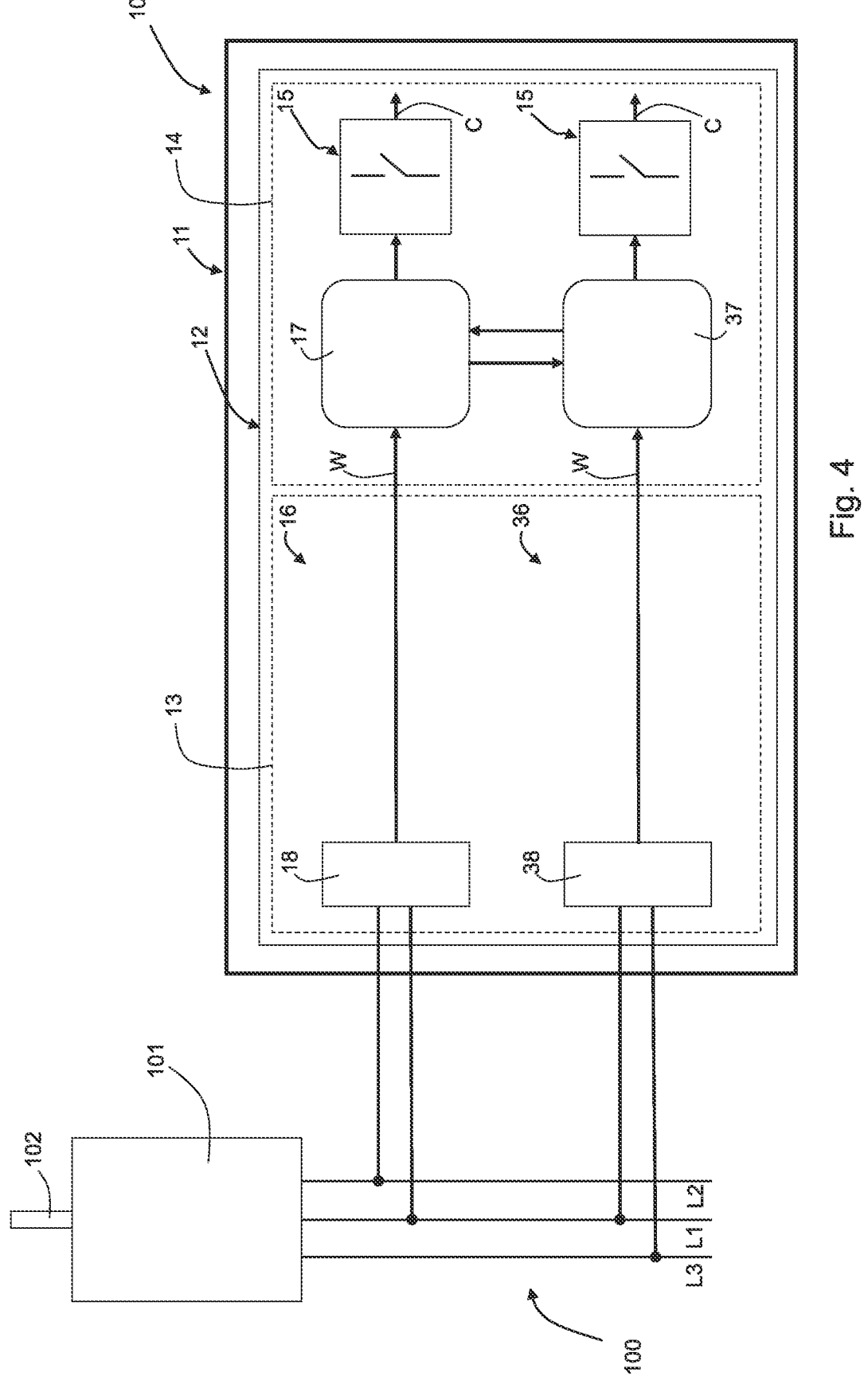

In a possible variant embodiment represented in FIG. 4, the first amplification means 18 can be connected directly to the first processing unit 17 to transmit a first work signal W thereto, preferably in analog form. In this case, the first processing unit 17 can be configured to execute FFT (Fast Fourier Transform) algorithms to obtain the frequency information.

Figure 5:
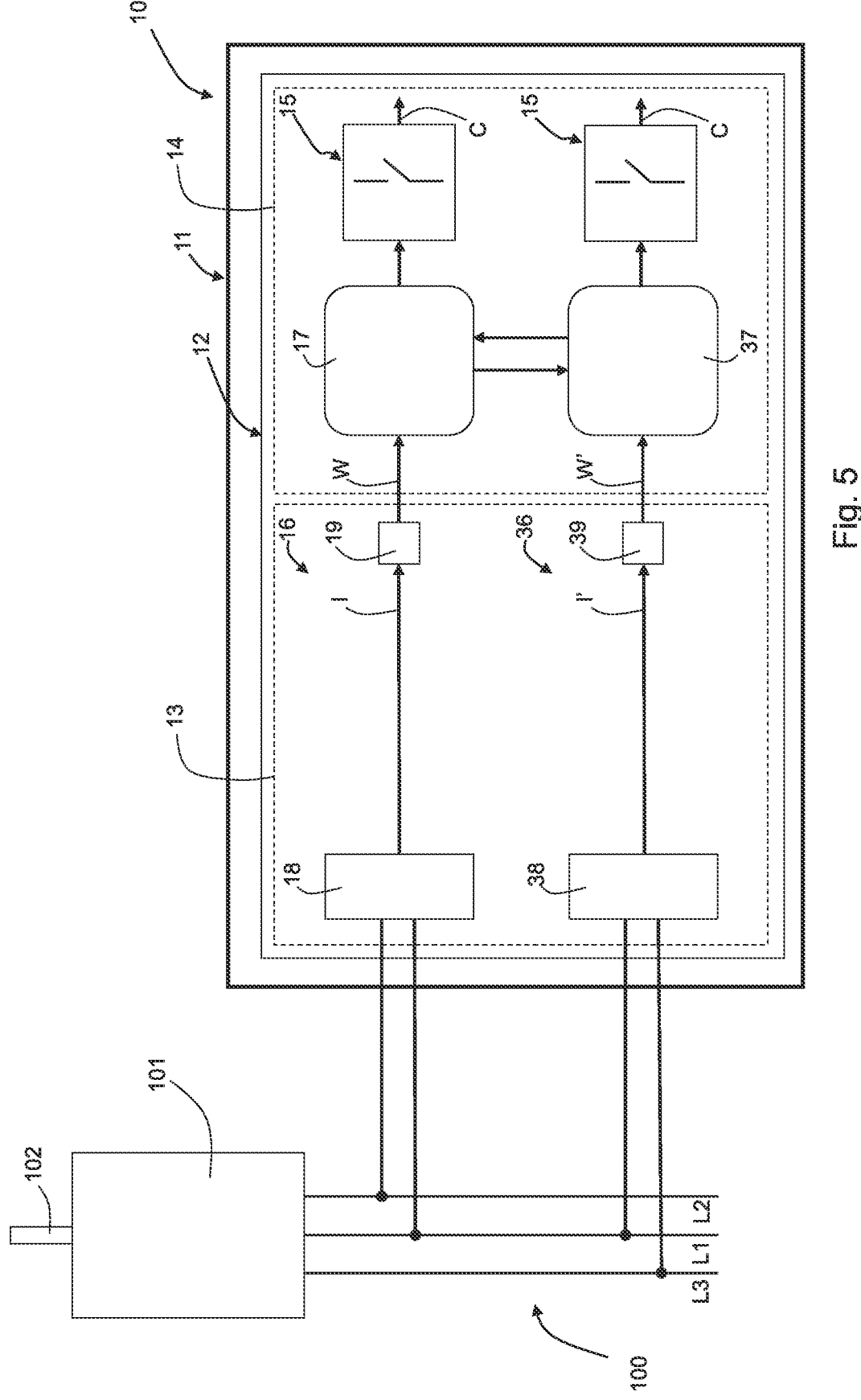
Figure 6:
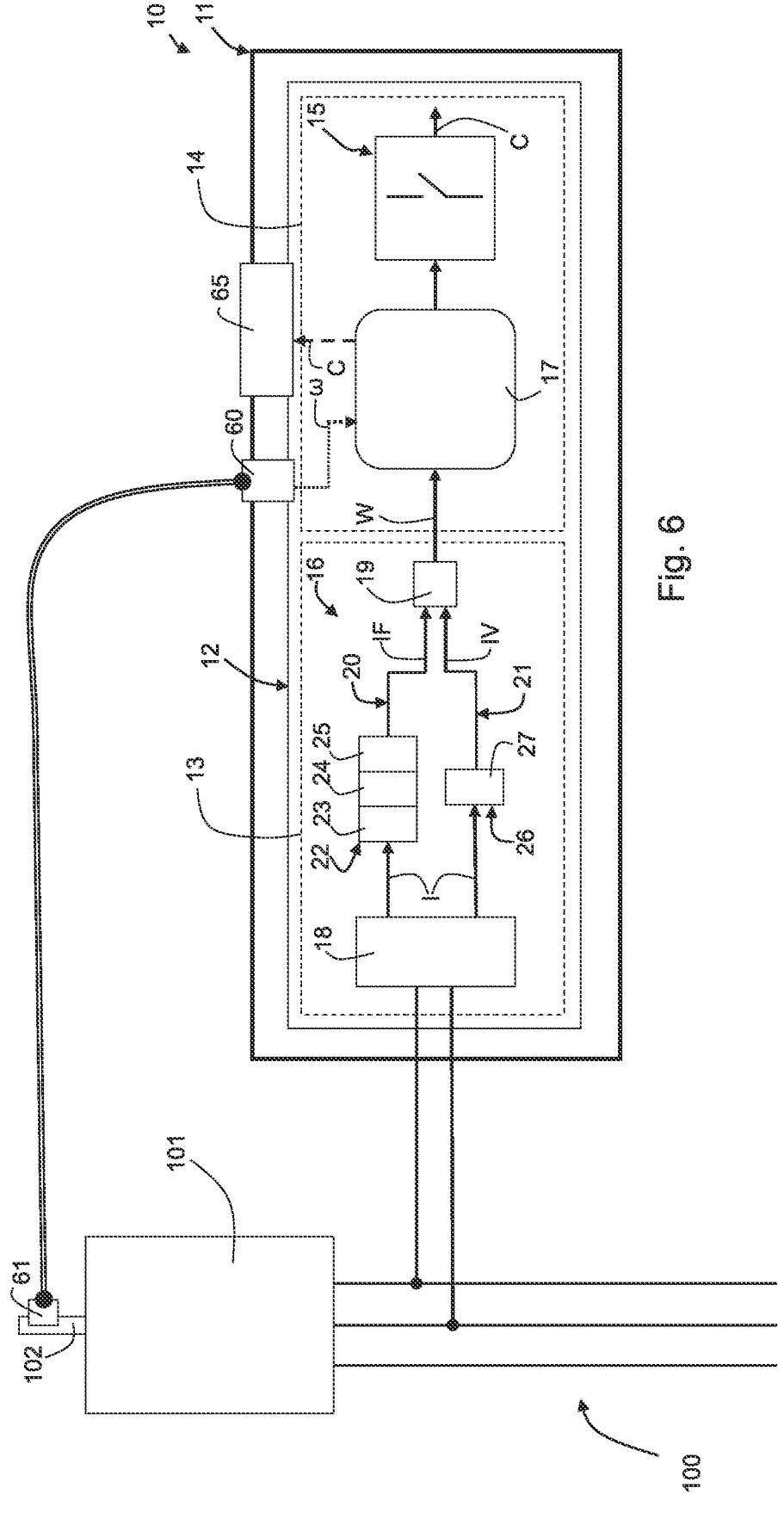

Or again, in a possible variant embodiment represented in FIG. 5, the first amplification means 18 can be connected directly to the first measurement unit 19 to transmit a single intermediate signal I thereto. In this case, the first measurement unit 19 can be configured to perform FFT (Fast Fourier Transform) algorithms to obtain the frequency information.

Figure 3:
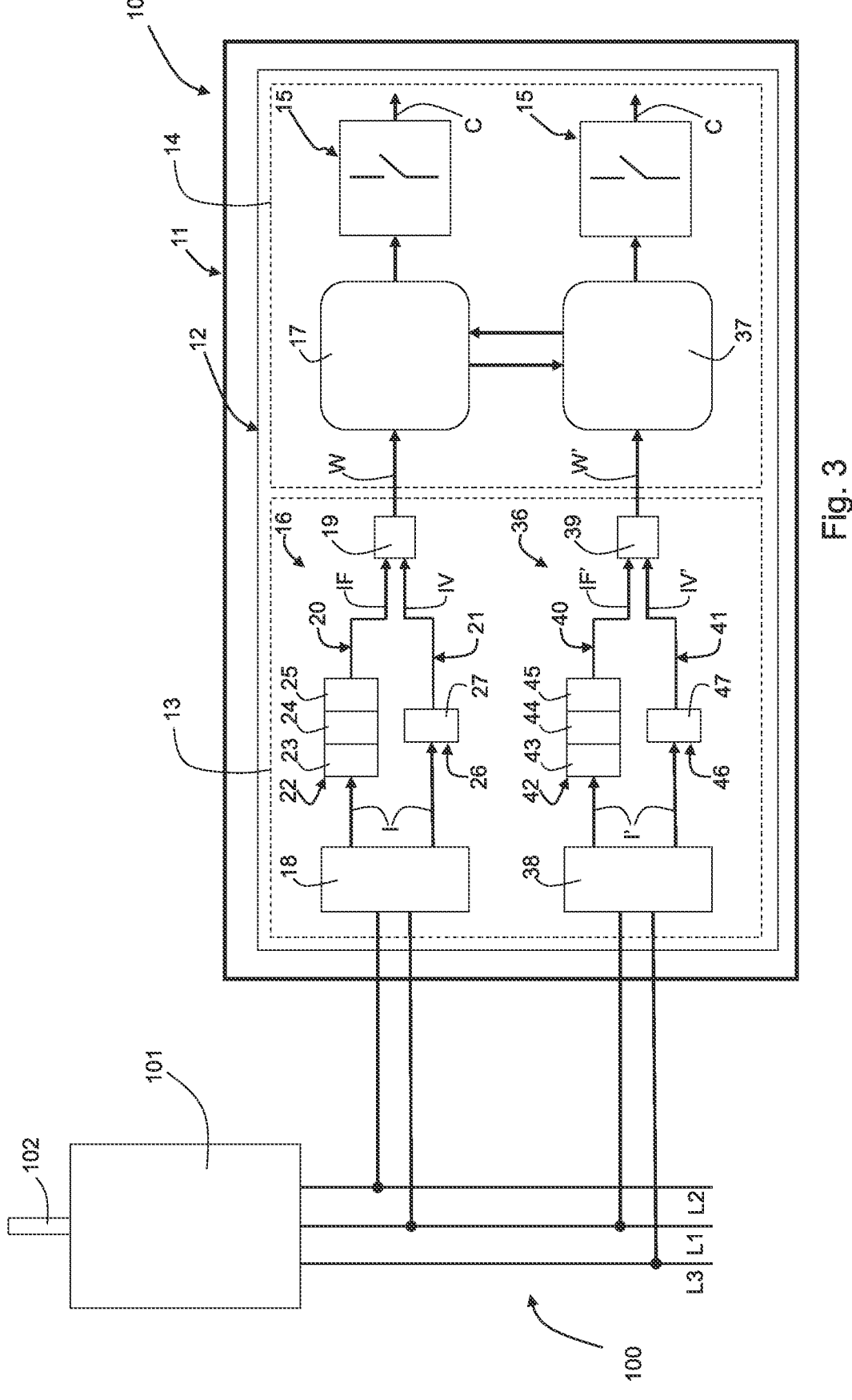
Figure 7:
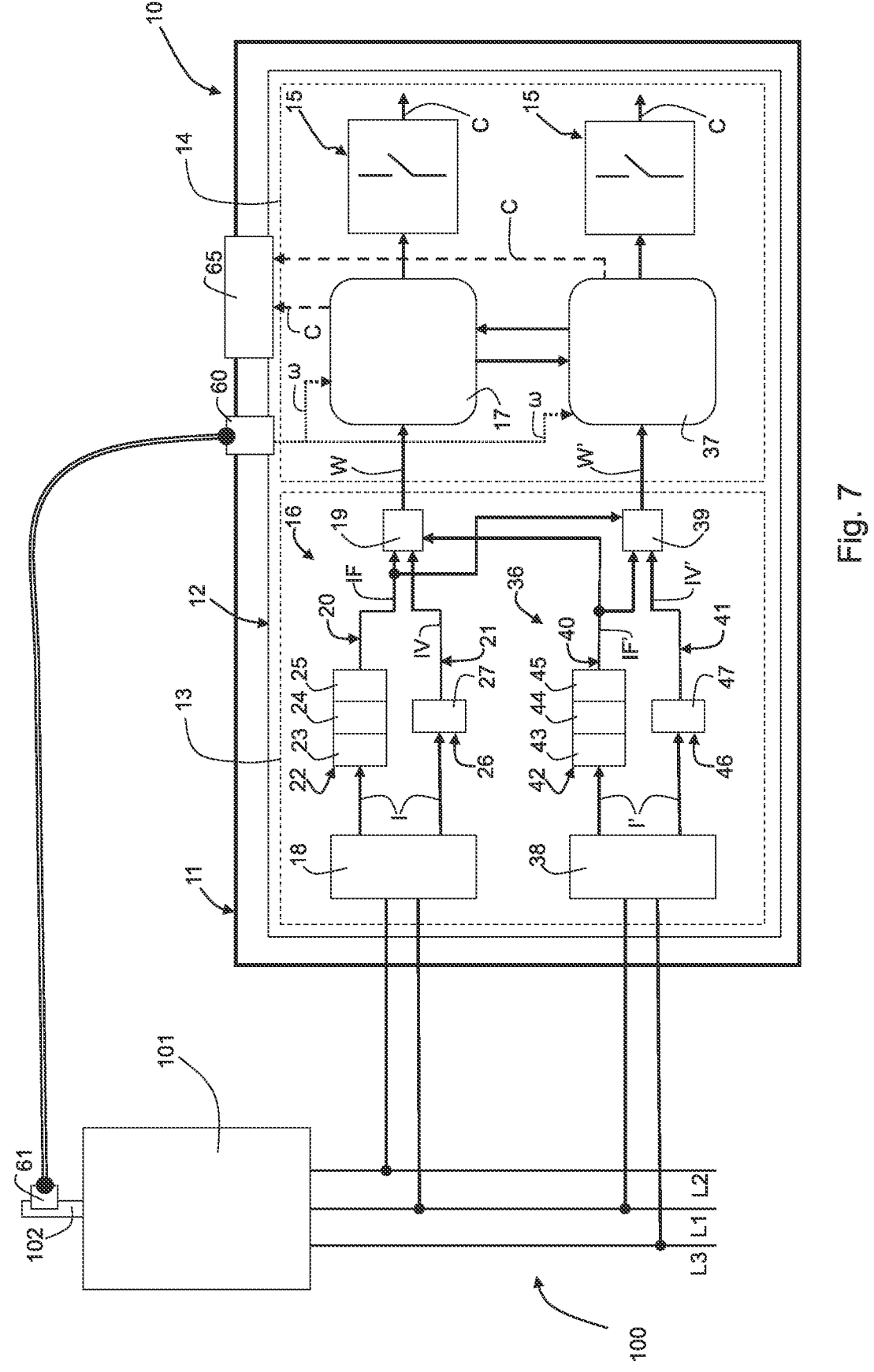

In another embodiment of the invention, represented schematically in FIG. 3 or 7, the input section 13 also comprises a second input channel 36 and the safety section 14 also comprises a second processing unit 37, which is part of the device 10, connected to both the second input channel 36 and the signaling means.

Advantageously, the presence of two input channels allows the presence of faults in the first and/or second input channels 16, 36 to be deduced and, therefore, the level of safety provided by the device 10 according to the invention to be increased.

Still advantageously, the first processing unit 17 and the second processing unit 37 can exchange and compare the values detected respectively by the first input channel 16 and by the second input channel 36 to verify that both input channels 16, 36 detect the same values.

Equally advantageously, it is possible for the processing units 17, 37 to exchange and compare the decisions they make on the basis of the values detected by the respective input channels 16, 36 to ensure they make the same decisions.

These aspects make it possible to increase safety and allow the detection of possible faults in the device.

The second input channel 36 is configured to be connected to the power supply 100 of the electric motor 101, in order to instantly detect the voltage applied thereto and transmit to the second processing unit 37 a second work signal W' correlated to said detected voltage.

It should be noted that herein and below, "voltage on the power supply" means the instantaneous voltage value that powers the electric motor 101 which, in case of an AC powered motor, varies over time according to a substantially sinusoidal function whose amplitude is the value of the supply voltage of the electric motor 101 and the period is the reciprocal of the supply voltage of the electric motor 101.

For example, in case the power supply 100 of the electric motor 101 is of the three-phase type, the second input channel 36 can be connected in use to two phases L1, L3 of the power supply 100. Preferably, at least one of the two phases L1, L3, to which the second input channel 36 is connected in use, is different from the two phases L1, L2 to which the first input channel 16 is connected in use.

Preferably, the second input channel 36 comprises second amplification means 38 and a second measurement unit 39.

The second amplification means 38 are configured to be connected to the power supply 100 and to scale the detected voltage in order to transmit to the second measurement unit 39 at least one second intermediate voltage signal IV' having a voltage value lower than the detected voltage.

For example, the second intermediate voltage signal IV' is a square wave correlated to the trend over time of the voltage measured between two phases L1, L3 of the power supply 100 of the electric motor 101.

Merely by way of example, the second amplification means 38 comprise a differential amplifier, known per se and which will not be described in detail.

In the example represented in FIG. 3 or 7, the second amplification means 38 are connected to the second measurement unit 39 by means of a second frequency line 40 and a second voltage line 41.

The second frequency line 40 comprises second filtering circuits 42 of the second intermediate signal configured to provide the second measurement unit 39 with a second intermediate frequency signal IF' filtered by noise, and having a maximum value acceptable by the second measurement unit 39. In the example given herein, the second filtering circuits 42 comprise a first order filter 43, a comparator with hysteresis 44 and a voltage divider 45 which are known per se and will not be described in detail. One skilled in the art easily understands that the second filtering circuits 42 can also be different from what is described in this example.

The voltage line 41 comprises attenuation circuits 46 configured to provide the second measurement unit 39 with a second intermediate voltage signal IV' having a maximum voltage value acceptable by the second measurement unit 39. In particular, the attenuation circuits 46 comprise a voltage divider 47 which is known per se and will not be described in detail. Also in this case, one skilled in the art easily understands that the second attenuation circuits 46 can also be different from what is described in this example.

The second measurement unit 39 is configured to sample the second intermediate frequency signal IF' and the second intermediate voltage signal IV'. Furthermore, the second measurement unit 39 is configured to process the second intermediate frequency signal IF' to obtain frequency information of said electric motor 101. This processing can provide the measurement of the period of the second intermediate frequency signal IF' and therefore its frequency.

Furthermore, the second measurement unit 39 is configured to process the second intermediate voltage signal IV' to obtain voltage information correlated to the voltage measured on the power supply 100. In the example provided herein, the second measurement unit 39 instantly measures the voltage of the second intermediate voltage signal IV' and the measured value corresponds to said voltage information.

The second measurement unit 39 is configured to transmit to the second processing unit 37 the aforementioned second work signal W' containing said frequency information and said voltage information, preferably in digital form. Also the second processing unit 37 is configured to compare the voltage information with the frequency information contained in said second work signal W'.

In this case, the comparison is performed to verify that when the voltage information is less than a lower voltage limit, also the frequency information is less than a lower frequency limit, corresponding for example to 1 Hz. In case this condition is not verified, the second processing unit 37 is configured to generate a control signal C to signal a fault. Said control signal C can be transmitted by controlling said switching means 15 to switch them from the active state to the off state, or vice versa. Otherwise, said control signal C can be transmitted in digital form to external users by means of the auxiliary output 65.

In another embodiment the second processing unit 37 is configured to compare the voltage information contained in said second work signal W' with the speed signal ω. In this case, the second processing unit 37 performs the comparison to verify that, if the voltage information is zero, also the speed signal ω is zero. In case this condition is not verified, the second processing unit 37 is configured to generate a control signal C to signal a fault. Said control signal C can be transmitted by controlling the switching means 15 to switch them from the active state to the off state, or vice versa. Otherwise, said control signal C can be transmitted in digital form to external users by means of the auxiliary output 65.

In a further embodiment the second processing unit 37 is configured to compare the frequency information contained in said second work signal W' with the speed signal ω. In this case, the comparison is performed in order to detect any anomalous blocking or slipping situations. If the second processing unit 37 detects that the frequency on the power supply 100 is greater than zero and the rotation speed is zero, then it generates a control signal C which indicates a blocking situation. Instead, if the second processing unit 37 detects that the frequency on the power supply 100 corresponds to a speed greater or lower than the rotation speed actually measured on the drive shaft 102, it generates a control signal C which indicates a slipping situation. In this case a control signal C can be generated by commanding the switching means 15 to switch them from the active state to the off state, or vice versa. Otherwise, the control signal C can be transmitted in digital form to external users by means of the auxiliary output 65, possibly also signaling the extent of slipping.

Advantageously, this configuration allows the presence of faults or anomalies to be deduced in a redundant manner and, therefore, the level of safety provided by the device 10 of the invention to be increased.

In alternative embodiments, an example of which is represented in FIG. 4, the second amplification means 38 can be connected directly to the second processing unit 37 to transmit the second work signal W' thereto, preferably in analog form. In this case, the second processing unit 37 can be configured to execute FFT (Fast Fourier Transform) algorithms to obtain the frequency information.

Or again, in other variant embodiments, an example of which is shown in FIG. 5, the second amplification means 38 can be connected directly to the second measurement unit 39 to transmit a single intermediate signal I' thereto. In this case, the second measurement unit 39 can be configured to perform FFT (Fast Fourier Transform) algorithms to obtain the frequency information.

Preferably, the first and second processing units 17, 37 are connected in a redundant manner to each other to perform a consistency control between the first and second work signals W, W'.

Advantageously, this configuration allows the presence of faults in the first and/or second input channels 16, 36 to be deduced and, therefore, the level of safety provided by the device 10 of the invention to be increased.

Preferably, but not necessarily, the input section 13 and the safety section 14 are obtained from a single printed circuit and are separated from each other by an insulating barrier (not shown). Advantageously, the insulating barrier also cooperates with the walls of the case 11 to define an electrical separation between the input section 13 and the safety section 14. This makes it possible to avoid any malfunctions or faults of the safety section 14 caused by the high voltage in the input section 13, consequently increasing the safety level of the device 10 of the invention.

For example, the insulating barrier can consist of one or more photo-couplers, or opto-isolators, arranged between the input channels 16, 36 and the processing units 17, 37. For example, a first photo-coupler can be interposed between the first measurement unit 19 and the first processing unit 17 to transmit the first work signal W and a second photocoupler can be interposed between the second measurement unit 39 and the second processing unit 37 to transmit the second work signal W'.

Figure 8:
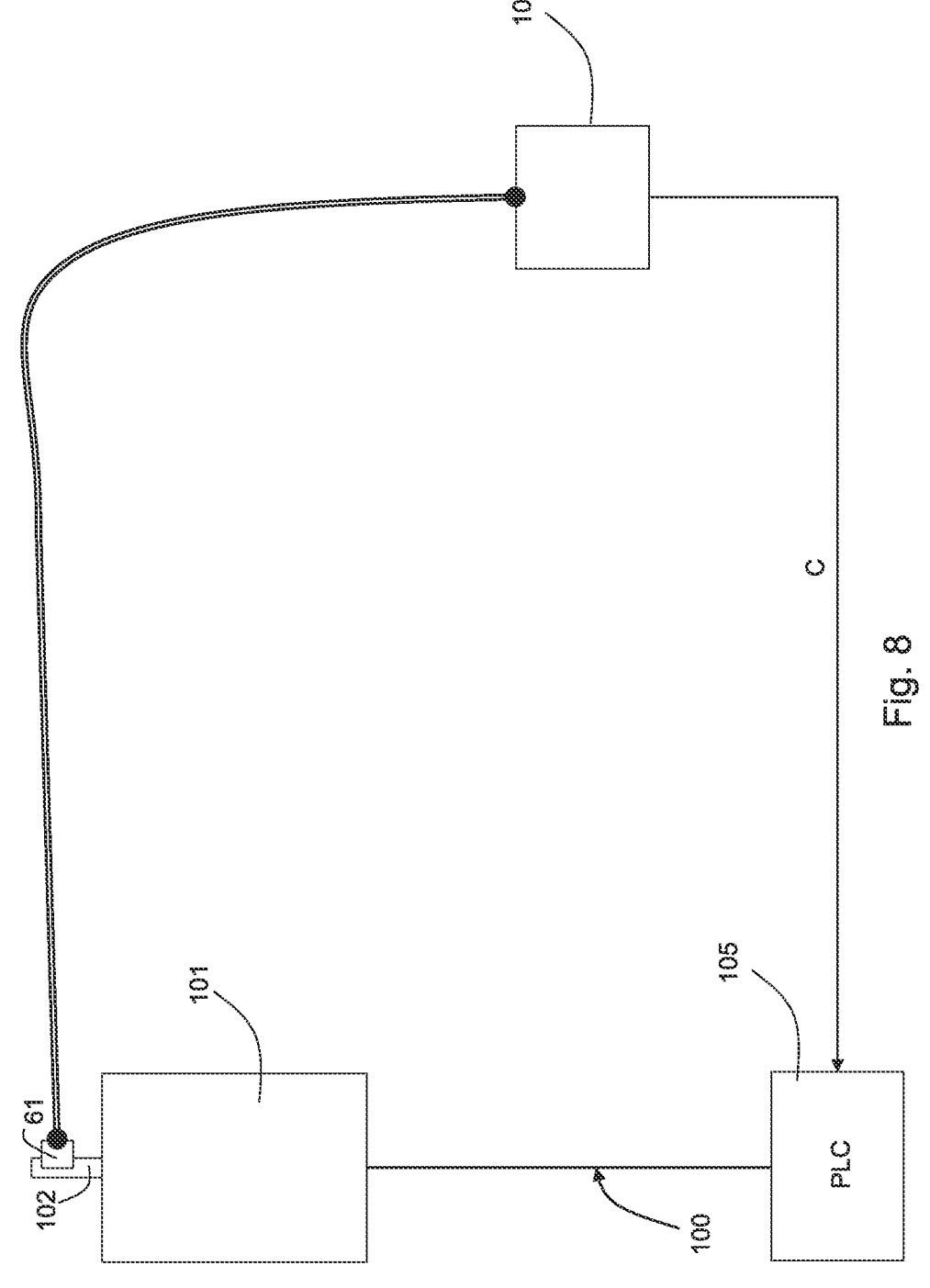

With reference to FIG. 8, the present invention also refers to a safety system for electric motors which comprises an electric motor 101 connected to a power supply line 100 and the aforementioned safety device 10, which is connected to said power supply line 100 to detect said at least two physical quantities.

Preferably the system also includes a controller 105, for example a PLC, connected to said signaling means and configured to receive a control signal C and to control the electric motor according to the control signal C.

More specifically, the controller 105 usually controls an inverter (not shown in FIG. 8) which, in turn, controls the electric motor 101 and the safety device 10 communicates with the controller 105 and also directly controls two contactors placed upstream of the inverter (which are also not shown) to cut off power to the electric motor 101 in the event that an unsafe situation occurs.

The present invention also refers to a safety method for electric motors which provides a detection phase S1, wherein at least two quantities related to and associated with the operation of the electric motor 101 are detected. Said at least two physical quantities are selected from the voltage measured on the power supply line 100, the frequency measured on the power supply line 100 and the actual rotation speed of the electric motor 101.

During the detection phase S1, the input section 13 detects the voltage on the power supply 100 and transmits to the safety section 14 at least one work signal W correlated to the detected voltage. Optionally, the detection phase S1 also provides that the sensor 61 detects the actual rotation speed of the drive shaft 102 of the electric motor 101.

The method also includes a processing phase S3, according to which at least the first processing unit 17 compares said at least two detected quantities with each other and transmits a control signal C based on said comparison.

For example, the at least two quantities can be the frequency and the voltage detected on the power supply 100 and the comparison can be performed to detect any faults. In this case, if a frequency greater than zero and zero voltage are detected on power supply 100, a fault is signaled.

Alternatively, the at least two quantities detected can be the actual rotation speed of the electric motor 101 and the voltage on the power supply 100 and the comparison is performed to detect any faults. In this case, if a rotation speed greater than zero and a zero voltage are detected on the power supply 100, a fault is signaled.

Again alternatively, the at least two quantities detected can be the frequency on the power supply 100 and the rotation speed of the electric motor 101 and the comparison is performed to detect any anomalous blocking or slipping situations. In this case, if the frequency on the power supply 100 is greater than zero while the rotation speed is zero, then a blocking situation is signaled. Instead, if the frequency on the power supply 100 corresponds to a speed greater or lower than the rotation speed actually measured on the drive shaft 102 of the electric motor 101, a slipping situation is signaled.

Figure 9:
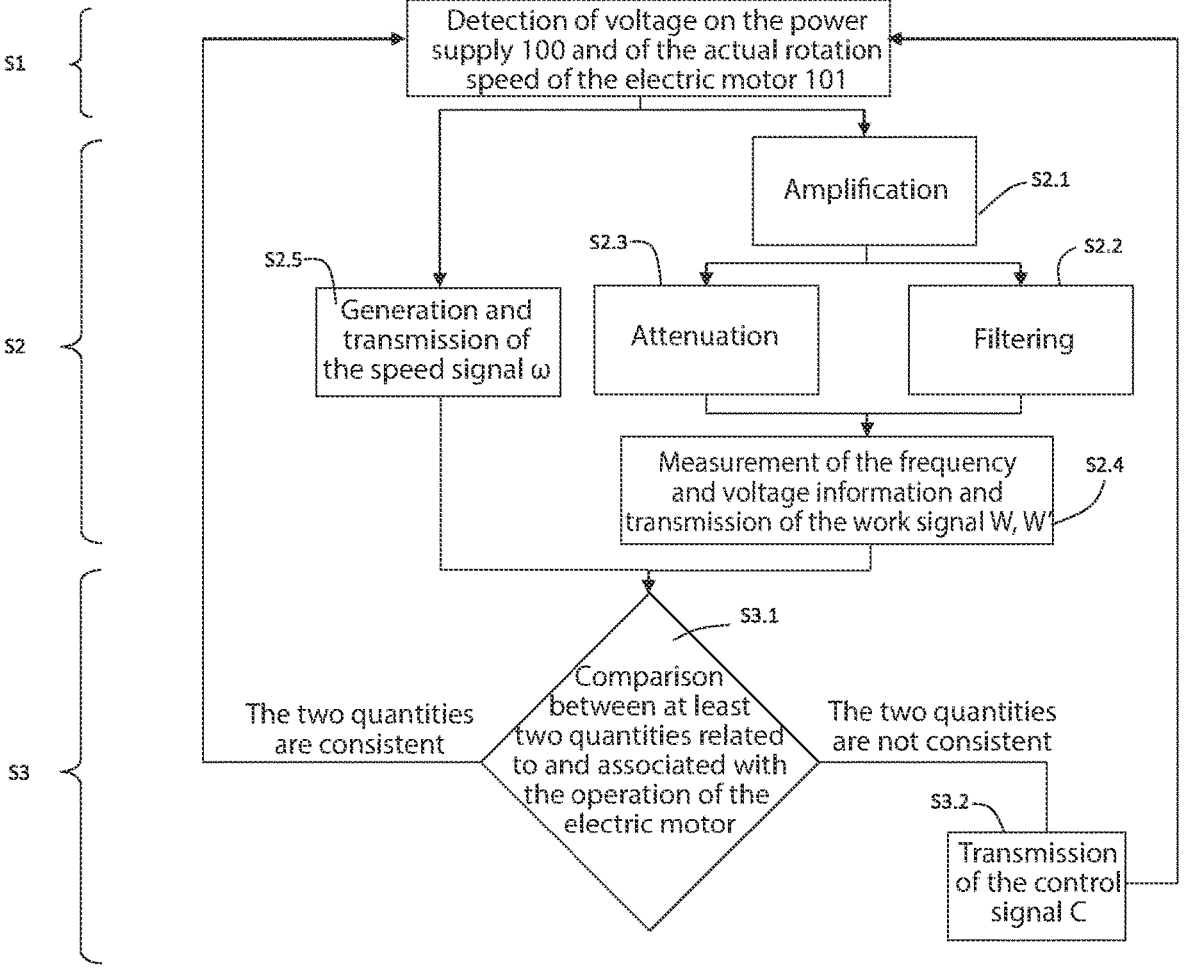
FIG. 9 is a flowchart of the safety method in accordance with an embodiment of the present invention.

With reference to FIG. 9, in phase S1 at least the first input channel 16 detects the voltage or frequency on the power supply line 100 of the electric motor 101, while, in a subsequent preparation phase S2, at least the first input channel 16 processes the voltage or frequency detected on the power supply line 100 and transmits at least one first work signal W to at least one first processing unit 17.

Furthermore, the detection phase S1 also provides that the sensor 61 detects the actual rotation speed of the drive shaft 102 of the electric motor 101 and the preparation phase S2 provides that the sensor 61 generates and transmits the speed signal ω to the first processing unit 17.

Obviously, two input channels 16, 36 can be provided for the transmission of respective work signals W, W' to respective processing units 17, 37 included in the safety section 14. Furthermore, also the sensor 61 can be arranged for the transmission of the speed signal ω to respective processing units 17, 37 included in the safety section 14.

Optionally, for the transmission of the at least one first work signal W the preparation phase S2 can provide an amplification sub-phase S2.1, according to which the amplification means 18, 38 scale the detected voltage and transmit to the respective measurement unit 19, 39 at least one respective intermediate voltage signal IV, IV' having a lower value than the detected value.

Furthermore, the preparation phase S2 can also comprise a filtering sub-phase S2.2, according to which each intermediate signal I is filtered by the respective filtering circuits 22, 42 to provide the respective measurement unit 19, 39 with a respective intermediate frequency signal IF, IF'. In addition, the preparation phase S2 can also comprise an attenuation sub-phase S2.3, according to which each intermediate signal I is attenuated by the respective attenuation circuits 26, 46 to provide the respective measurement unit 19, 39 with a respective intermediate voltage signal IV, IV'.

The preparation phase S2 also comprises a measurement sub-phase S2.4, according to which each measurement unit 19, 39 performs a measurement of the respective intermediate frequency signal IF, IF' and of the intermediate voltage signal IV, IV' to obtain frequency information and voltage information. Furthermore, during the measurement sub-phase S2.4, each measurement unit 19, 39 transmits to the respective processing unit 17, 37 a work signal W, W' containing the respective frequency information and the respective voltage information.

Optionally, if provided, during the measurement sub-phase S2.4, the first measurement unit 19 also processes the second intermediate frequency signal IF' and the second measurement unit 39 also processes the first intermediate frequency signal IF to measure information on the direction of rotation of the electric motor 101. In this case, each measurement unit 19, 39 transmits to the respective processing unit 17, 37 a work signal W, W' also containing the respective information on the direction of rotation.

From the above description, the features of the safety device and method for controlling an electric motor, which are the object of the present invention, are clear, as are the advantages deriving from them.

The invention thus conceived is susceptible to numerous modifications and variations, all of which fall within the scope of protection of the attached claims.

Furthermore, all details can be replaced by other technically equivalent elements; in practice, the materials used, as well as the contingent shapes and dimensions, can be varied based on contingent needs and the state of the art.

Where the construction features and techniques mentioned in the following claims are followed by reference numbers, such reference numbers have been affixed for the sole purpose of increasing the comprehensibility of the claims and, consequently, do not constitute in any way a limitation on the interpretation of each identified element.

The invention claimed is:

1. A safety device (10) for monitoring an electric motor (101), said electric motor (101) being connected to a power supply line (100) and being equipped with a drive shaft (102), characterized in that said safety device (10) comprises a control unit (12) having:

detection means configured for being associated with said electric motor (101) to detect at least two physical quantities related to and associated with the operation of said electric motor (101), said at least two physical quantities being selected from the actual rotation speed of said electric motor (101), the voltage measured on said power supply line (100) and the frequency measured on said power supply line (100), wherein said detection means comprise at least one first input channel (16) configured to be connected to said power supply line (100) of the electric motor (101) in order to instantly detect the voltage on said power supply line (100) and to transmit at least one first work signal (W) correlated to said detected voltage to at least one first processing unit (17);

signaling means configured to transmit a control signal (C) generated by said at least one first processing unit (17), wherein said signaling means comprise switching means (15) controlled by said at least one first processing unit (17);

wherein said at least one first processing unit (17) is connected to said detection means and to said signaling means;

wherein said at least one first processing unit (17) is configured to compare said at least two physical quantities with each other, which are related to and associated with the operation of said electric motor (101) in order to detect faults or anomalies and to generate said control signal (C) on the basis of said comparison;

wherein said detection means further comprise:

at least one second input channel (36) configured to be connected to said power supply line (100) of said electric motor (101) in order to instantly detect the voltage applied to said power supply line (100) and to transmit a second work signal (W'), correlated to said voltage detected, to at least one second processing unit (37) comprised in said device (10);

wherein said at least one second input channel (36) comprises at least one second measurement unit (39) connected to said second processing unit (37) and second amplification means (38) configured to be connected to said power supply line (100) and to transmit to said second measurement unit (39) at least one second intermediate voltage signal (IV') and at least one second intermediate frequency signal (IF'), said second measurement unit (39) being configured to measure said at least one second intermediate voltage signal (IV') and said at least one second intermediate frequency signal (IF') and to transmit said at least one second work signal (W') to said second processing unit (37).

2. The device (10) as in claim 1, characterized in that said second processing unit (37) is connected to said at least one second input channel (36) and to said switching means (15) and configured to control said switching means (15) generating at least one second activation signal (AV', AF') according to said at least one second work signal (W'), said second processing unit (37) being configured to compare said at least two physical quantities, which are relative and associated with the operation of said electric motor (101) in order to detect faults or anomalies and to generate said control signal (C) on the basis of said comparison.

3. The device (10) of claim 1, characterized in that said second channel (36) further comprises a second frequency line (40), which is interposed between said second amplification means (38) and said second measurement unit (39) and which includes filtering circuits (42) of said second intermediate frequency signal (IF'), and a second voltage line (41), which is interposed between said second amplification means (38) and said second measurement unit (39) and which comprises attenuation circuits (46) of said second intermediate voltage signal (IV').

4. The device (10) of claim 1, characterized in that said first and second processing units (17, 37) are connected to each other in a redundant manner.

5. The device of claim 1, characterized in that said detection means comprise a sensor input (60) connected to said at least one first processing unit (17) and to a rotation sensor (61), which is configured to detect said actual rotation speed of said electric motor (101) and to transmit a speed signal (ω) to said at least one first processing unit (17).

6. The device of claim 1, characterized in that said signaling means comprise an auxiliary output (65) configured to be connected to an external auxiliary device and to allow the transmission of said control signal (C) between said auxiliary external device and said at least one first processing unit (17).

7. A safety system for electric motors (101) comprising a safety device (10) as in claim 1, characterized in that said system comprises a controller (105) connected to said signaling means and configured to receive said control signal (C) and to control said electric motor (101) according to said control signal (C).

8. A safety method for electric motors (101) by means of a safety device as in claim 1 wherein an electric motor (101), equipped with a drive shaft (102), is connected to a power supply line (100), characterized in that said method provides at least the following phases:

a detection phase (S1), according to which detection means detect at least two physical quantities associated with the operation of said electric motor (101), said at least two quantities being selected from the actual rotation speed of said electric motor (101), the voltage measured on said power supply line (100) and the frequency measured on said power supply line (100);

a preparation phase (S2), according to which one or more signals (W, ω) relating to said at least two detected physical quantities are transmitted to at least one first processing unit (17);

a processing phase (S3), according to which said at least one first processing unit (17) compares said at least two detected physical quantities with each other in order to detect faults or anomalies and transmits a control signal (C) by means of signaling means based on said comparison in order to signal said faults or anomalies.

9. Safety method as in claim 8, characterised in that said at least two physical quantities are selected from the voltage on said power supply line (100) of said electric motor (101), the frequency on said power supply line (100) of said electric motor (101) and the effective rotational speed of said drive shaft (102).

\* \* \* \* \*